United States Patent [19]

Salih

[11] Patent Number: 5,097,308

[45] Date of Patent: Mar. 17, 1992

[54] METHOD FOR CONTROLLING THE SWITCHING SPEED OF BIPOLAR POWER DEVICES

[75] Inventor: Ali Salih, Levittown, N.Y.

[73] Assignee: General Instrument Corp.

[21] Appl. No.: 492,117

[22] Filed: Mar. 13, 1990

[51] Int. Cl.[5] .................................. H01L 29/72
[52] U.S. Cl. .............................. 357/34; 357/16; 357/4; 357/60; 357/64; 357/29; 357/88
[58] Field of Search .............. 357/34, 60, 16, 4, 64, 357/29, 88

[56] References Cited

U.S. PATENT DOCUMENTS

| | | | |
|---|---|---|---|
| 3,821,784 | 6/1974 | Heald et al. | 357/64 |
| 4,024,569 | 3/1977 | Hawrylo et al. | 357/60 |
| 4,053,925 | 10/1977 | Burr et al. | 357/64 |
| 4,111,719 | 9/1978 | Mader et al. | 357/91 |
| 4,291,329 | 9/1981 | Hanes et al. | 357/64 |
| 4,529,455 | 7/1985 | Bean et al. | 437/131 |
| 4,754,315 | 6/1988 | Fisher et al. | 357/64 |
| 4,825,269 | 4/1989 | Plummer et al. | 357/34 |
| 4,905,063 | 2/1990 | Beltram et al. | 357/16 |
| 4,918,496 | 4/1990 | Matsushima et al. | 357/16 |

FOREIGN PATENT DOCUMENTS

| | | | |
|---|---|---|---|
| 0327316 | 8/1989 | European Pat. Off. | 357/64 |
| 59-084543 | 5/1984 | Japan | 357/60 |
| 61-105832 | 5/1986 | Japan | 437/132 |
| 61-294877 | 12/1986 | Japan | 357/60 |

*Primary Examiner*—Jerome Jackson, Jr.
*Assistant Examiner*—Hung Xuan Dang
*Attorney, Agent, or Firm*—James & Franklin

[57] ABSTRACT

The switching speed of bipolar power rectifiers is increased by formation of misfit dislocations in the depletion region, spaced from the substrate/epitaxial layer interface, in order to reduce minority carrier lifetime. The misfit dislocations are formed by the introduction of germanium during epitaxy, and are distributed along the silicon/silicon-germanium interface. Preferably, the germanium containing layer is located proximate the center of the depletion region.

12 Claims, 5 Drawing Sheets

METHOD FOR CONTROLLING THE SWITCHING SPEED OF BIPOLAR POWER DEVICES

The present invention relates to methods for fabricating bipolar power semiconductor devices, such as power rectifiers or the like and in particular to a method for controlling the switching speed of such devices through the use of misfit dislocations.

BACKGROUND OF THE INVENTION

Field of the Invention

Defects and impurities are inherent in grown silicon crystals. Processing of the silicon introduces additional defects and impurities. Heavy metallic impurities, such as copper, gold, chromium and nickel degrade the performance of devices formed on the silicon.

One common means of reducing the effect of the metallic contaminants is through gettering. Mechanical gettering can be achieved by creating irregularities or defects at the backside of the wafer to which the metallic impurities are attracted. However, this process is not entirely satisfactory, particularly with thick wafers and low temperature processing where the gettering sites may prove to be too far from the source of the impurities. Further, high oxygen content may cause extended defects to nucleate. It is known to harness this phenomenon by intrinsic gettering which traps impurities closer to the active region of the device formed in a region denuded from defects. However, there are still major problems with respect to this gettering technique.

To overcome these problems, an alternative (extrinsic) gettering procedure has been used. This extrinsic technique involves the formation of a network of misfit dislocations along the substrate/epitaxial layer interface of the silicon. The dislocations are introduced by the controlled incorporation of germanium in the grown silicon matrix. This procedure produces dislocation arrays which are spaced from the device surface by pure, defect free silicon layers which are functionally similar to the denuded zone in intrinsic gettering.

During crystal epitaxial growth, small amounts of germanium containing gas is introduced over about 2-$\mu$m thickness and is thereafter capped with pure silicon to contain the entire active region of the device (4 to 8 $\mu$m). It has been found that the misfit dislocations along the silicon/silicon germanium layer interface function to getter metallic impurities away from the active region of the device.

For more information relating to extrinsic gettering by this method, the reader is referred to: "Extrinsic Gettering Via The Controlled Introduction of Misfit Dislocations," Salih et. al., Applied Physics Letter (46) (4) published Feb. 15, 1985 by the American Institute of Physics; "Extrinsic Gettering Via Epitaxial Misfit Dislocations" Vol. 133, No. 3 of the Journal of the Electrochemical Society; Electrochemical Science and Technology, March 1986; and Defect Engineering for VLSI Eptiaxial Silicon," Rozgonyi et. al., Journal Of Crystal Growth 85 (1987), pages 300 to 307.

It is also known that the switching speed of silicon bipolar devices can be increased by the introduction of heavy metallic impurities in the active region of the device. The impurities significantly reduce minority-carrier lifetime and proportionally shorten reverse recovery time. Gold and platinum impurities are often used, and are rapidly diffused into the silicon. However, because the solid solubilities of these impurities in silicon are very small, they tend to precipitate or segregate at defects, disordered regions, and surfaces. Their diffusion is therefore difficult to control and is sensitive to process conditions, particularly the diffusion temperature and time, as well as inherent and/or process induced imperfections in the silicon material.

Because of their segregation properties, large amounts of the metallic impurities must be introduced into the silicon to achieve the desired concentrations of electrically active species in the space-charge region of fast rectifiers, or the base of transistors. The electrical activity of metal precipitates is also known to be smaller than that of solutes atoms which enhance carrier generation responsible for lifetime killing. In addition, the metallic impurities nonuniformly compensate and reduce mobility, giving rise to nonuniform breakdown voltage and large forward voltage drop. Also each metallic species is associated with a fixed set of recovery characteristics, such as leakage and forward voltage drop. Combination of metal impurities to tailor recovery characteristics may be very difficult and have not been used for commercial power devices.

The present invention utilizes misfit dislocations to enhance the switching speed of power rectifiers, particularly fast recovery power rectifiers, because they produce small leakage current and are metallurgically and electrically stable, and thus, device performance does not significantly deteriortate under high power and temperature applications. Unlike processes where misfit dislocations have been previously used to remove impurities from the depletion region, in the present invention, the misfit dislocations are used to directly reduce minority carrier lifetime because they are associated with deep energy levels in the energy gap of silicon, like metallic impurities. Further, the misfit dislocations are not formed along the substrate/epitaxial layer interface as they are in the prior art extrinsic gettering technique. Instead, in the present invention, the misfit dislocations are deliberately formed within the active (depletion) region of the epitaxial layer, spaced from the interface between the epitaxial layer and the substrate. In the active region of the device, the misfit dislocations function like heavy metal impurities, thereby permitting great control over device parameters. Unlike metal impurities and structural defects formed by energetic beam irradiation, misfit dislocations are permanent defects that are not sensitive to high temperature processing short of melting the silicon material. They are also formed during the epitaxial growth and do not require additional processing steps as ones used to introduce metal impurities and structural defects. Thus, misfit dislocations provided in accordance with the present invention can be used effectively as an alternative to metal diffusion. However, the misfit dislocations can also be used as a compliment to metal diffusion to obtain significantly better results than conventional impurity introduction techniques. Flexible tailoring of recovery characteristics can be achieved by adjusting the densities of both misfit dislocations and metal impurities.

It is, therefore, a prime object of the present invention to provide a method of controlling the switching speed for bipolar power semiconductor devices, particularly fast recovery rectifiers.

It is another object of the present invention to provide a method of controlling the switching speed of bipolar power devices wherein misfit dislocations are employed directly to reduce minority carrier lifetime.

It is another object of the present invention to provide a method for controlling the switching speed for bipolar power devices through the use of misfit dislocations in the depletion region, alone or in conjunction with heavy metal diffusion.

It is another object of the present invention to tailor recovery characteristics by controllable introduction of both misfit dislocations and metal impurities.

It is another object of the present invention to provide a method for controlling the switching speed of bipolar power devices wherein one or more regions of misfit dislocations are formed in the depletion region of the device, spaced from the substrate/epitaxial layer interface of the device.

It is another object of the present invention to provide a method for controlling the switching speed of bipolar power devices wherein areas of misfit dislocations are formed along interfaces between silicon and silicon-germanium regions within the epitaxial layer.

It is another object of the present invention to provide a bipolar power device including misfit dislocations in the depletion region, spaced from the substrate/epitaxial layer interface.

In accordance with one aspect of the present invention, a method is provided for controlling the switching speed of bipolar power semiconductor devices of the type comprising a silicon substrate, an epitaxial layer comprising a silicon substrate, an epitaxial layer comprising a depletion region and a diffused layer. The method comprises the step of forming misfit dislocations in the depletion region.

The area in which the misfit dislocations are formed is spaced from the substrate/epitaxial layer interface. Preferably, the misfit dislocations are formed proximate the center of the depletion region.

The misfit dislocations forming step preferably comprises the step of forming a germanium containing layer in the depletion region in an area substantially spaced from the substrate/epitaxial layer interface. This may be accomplished by introducing germanium into the epitaxial region during epitaxy. The germanium is introduced in the range of approximately 1% to 10% by exposing the epitaxial material to a germanium containing gas as it is formed.

The misfit dislocations may be on the <100> plane or the <111> plane. The misfit dislocations are formed along the silicon/silicon germanium interface.

Multiple areas of misfit dislocations may be formed by forming a plurality of spaced germanium containing layers separated by pure silicon layers in the depletion region. The misfit dislocations will form along each silicon/silicon-germanium interface.

Metallic impurities may be introduced into the depletion region in conjunction with the formation of the misfit dislocations. Doing so enhances the concentration of the metallic impurities proximate the misfit dislocations. The misfit dislocations act as getter sites for the metallic impurities within the depletion region providing the largest concentrations of the metallic impurities in the depletion region.

In accordance with another aspect of the present invention, a bipolar power semiconductor device is provided. The device comprises a silicon substrate, an epitaxial layer comprising a depletion region and a diffused layer. An interface between the substrate and the epitaxial layer is present. Misfit dislocations are provided in the depletion region.

The area in which the misfit dislocations are formed is spaced from the substrate/epitaxial layer interface. Preferably, it is proximate the center of the depletion region.

The device further comprises germanium containing regions, having silicon/silicon-germanium interfaces, formed in the depletion region. The area of misfit dislocations is at the silicon/silicon-germanium interface. The germanium containing region preferably comprises germanium in the range of from 1% to 10%.

The device may include a plurality of areas of misfit dislocations. Each of the areas is spaced from the substrate/epitaxial layer interface. Multiple areas of misfit dislocations may be formed by a plurality of spaced germanium containing regions, each having silicon/silicon-germanium interfaces. Misfit dislocations are formed at each of the silicon/silicon-germanium interfaces.

The device may further include metallic impurities with enhanced concentration proximate the misfit dislocations. The misfit dislocations form getter sites for the metallic impurities.

To these and such other objects which may hereinafter appear, the present invention relates to a method of controlling the switching speed of bipolar power devices as set forth in detail in the following specification and recited in the annexed claims, taken together with the accompanying drawings, wherein like numerals refer to like parts and in which:

DESCRIPTION OF PREFERRED EMBODIMENT

The present invention utilizes misfit dislocations formed within the depletion region as an alternative and a compliment to metal diffusion for the enhancement of the switching speed of power rectifiers. The misfit dislocations are generated in the <100> and <111> planes in the silicon by the introduction of germanium containing layers during epitaxy. The introduction of germanium within the range of 1% to 10% during epitaxy is preferred.

Figure 1:
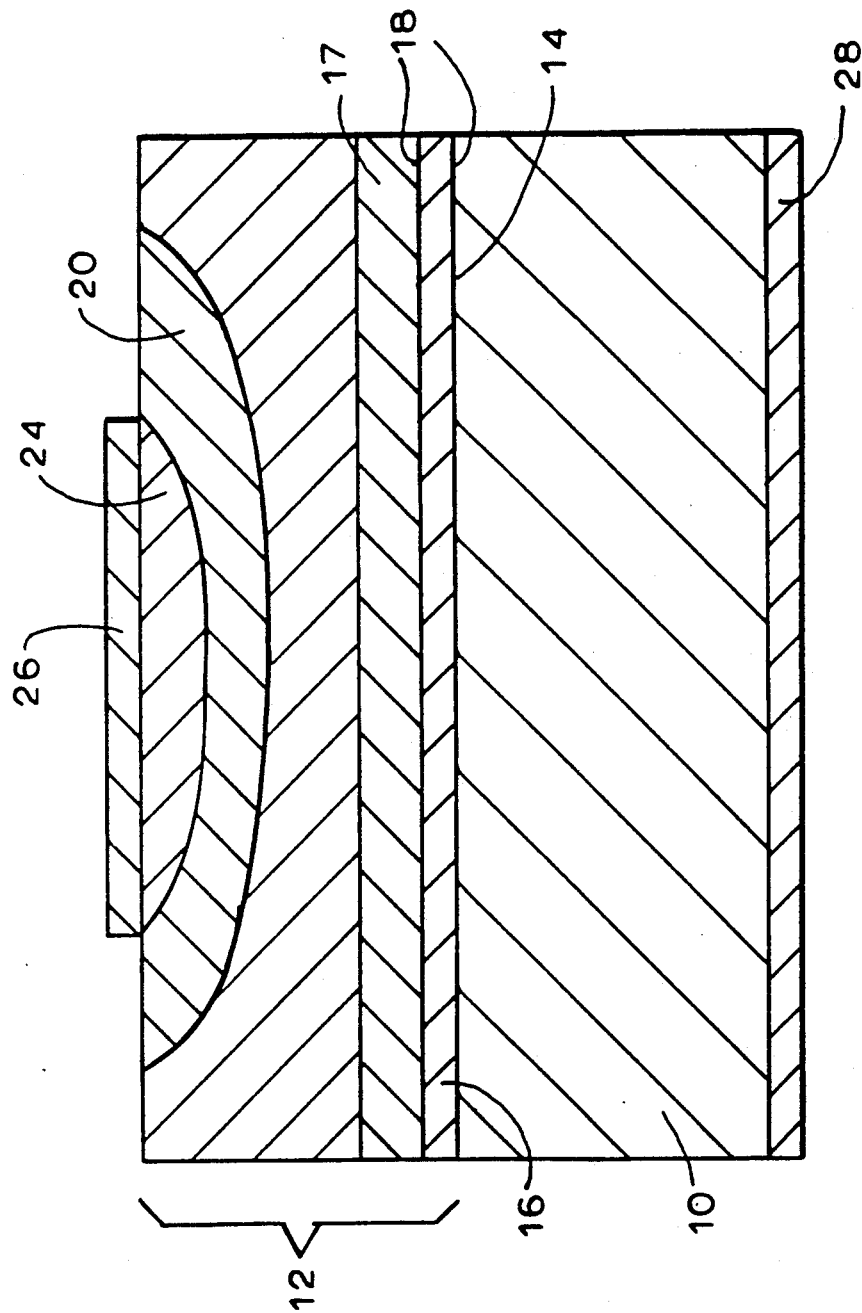
FIG. 1 is a schematic cross-sectional view of an idealized semiconductor device in which the prior art extrinsic gettering process is used.

Misfit dislocations have been heretofore used in bipolar semiconductor devices for extrinsic gettering of the active region. FIG. 1 is a representation of an idealized P/N junction device in which misfit dislocations are used as an extrinsic gettering technique.

Upon the N+ substrate 10 is formed an N− epitaxial layer 12, defining a substrate/epitaxial layer interface 14. Immediately adjacent interface 14 is a N— region 16 of silicon-germanium formed as the crystal is grown by introduction of germanium. Misfit dislocations are formed along the silicon/silicon-germanium interfaces 18. The lower interface 18 coincides precisely with substrate/epitaxial layer interface 14. The upper interface 18 is proximate interface 14, the thickness of region 16 being only approximately 1 to 2 $\mu$m. Above region 16 is formed a N+ region 17 of pure silicon, approximately 4 to 10 $\mu$m thick. Regions 16 and 17 together become a N+ diffused region upon diffusion of substrate dopant during epitaxy and further device fabrication.

Epitaxial layer 12 normally has an N— conductivity. Within layer 12, the active region of the device, depletion region 20 is formed. It should be noted that in this prior art technique, extrinsic gettering is achieved by the misfit dislocations along interfaces 18 which are situated in areas well remote from the depletion region 20.

A P+ diffusion region 24 is formed in epitaxial region 12, adjacent the surface of the device. A metalization layer 26 is formed over region 24. A second metalization layer 28 is formed along the underside of the device. This describes all the constituents of P+/N— junction diode.

Figure 2:
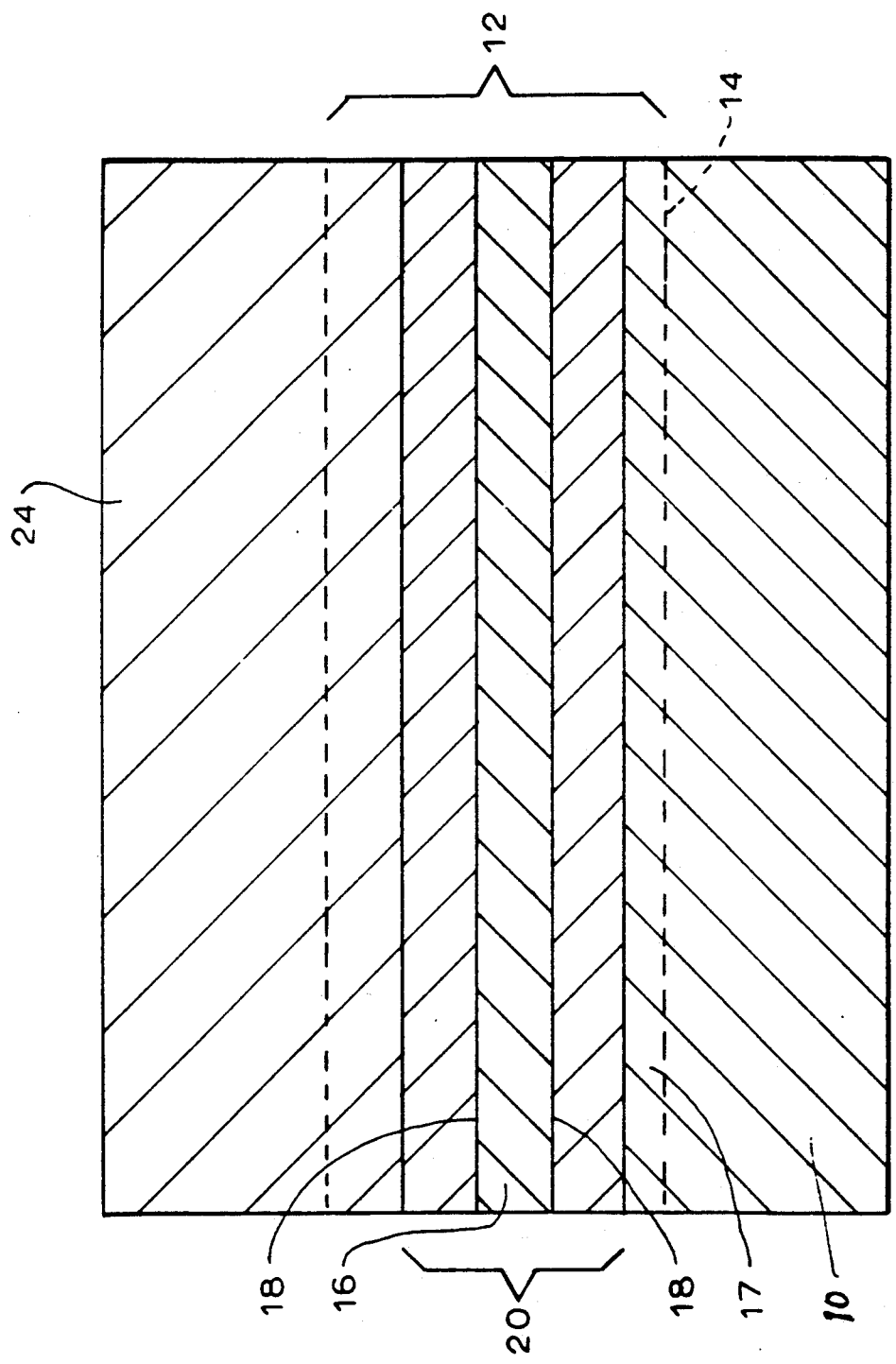
FIG. 2 is a schematic cross-sectional view of an idealized partially formed device with a single layer of silicon-germanium formed proximate the center of the depletion region, in accordance iwth the present invention.

FIG. 2 is a schematic representation of an idealized partially processed device, viewed in cross-section formed, in accordance with the present invention. The N+ substrate 10 has upon it an N— epitaxial layer 12 formed by conventional epitaxy processes utilizing, for example, a chemical vapor deposition reactor. Substrate/epitaxial layer interface 14 is formed between regions 10 and 12. Within region 12, above interface 14, is an N+ diffused layer 17. A P+ diffused region 24 is formed in the upper portion of the epitaxial layer 12.

The depletion region 20 is situated within epitaxial layer 12, below region 24. The lower edge of region 20 is spaced by region 17 from interface 14. Non-conventionally, within depletion region 20, and preferably proximate the center thereof, a germanium containing region 16 is formed by exposing the device to a source of germanium, such as 1% to 10% germanium containing gas, for example, GeH$_4$, as the epitaxial layer is grown. It is believed preferable to have region 16 proximate the center of depletion region 20 to optimize minority carrier recombination generation in the depletion mode of the diode.

Region 16 has silicon/silicon-germanium interfaces 18 proximate which the misfit dislocations are created. The misfit dislocations density per unit length is directly proportional to the germanium content or lattice strain produced at one or more of the interfaces 18. They are formed with substantially uniform distribution along the interfaces.

Figure 3:
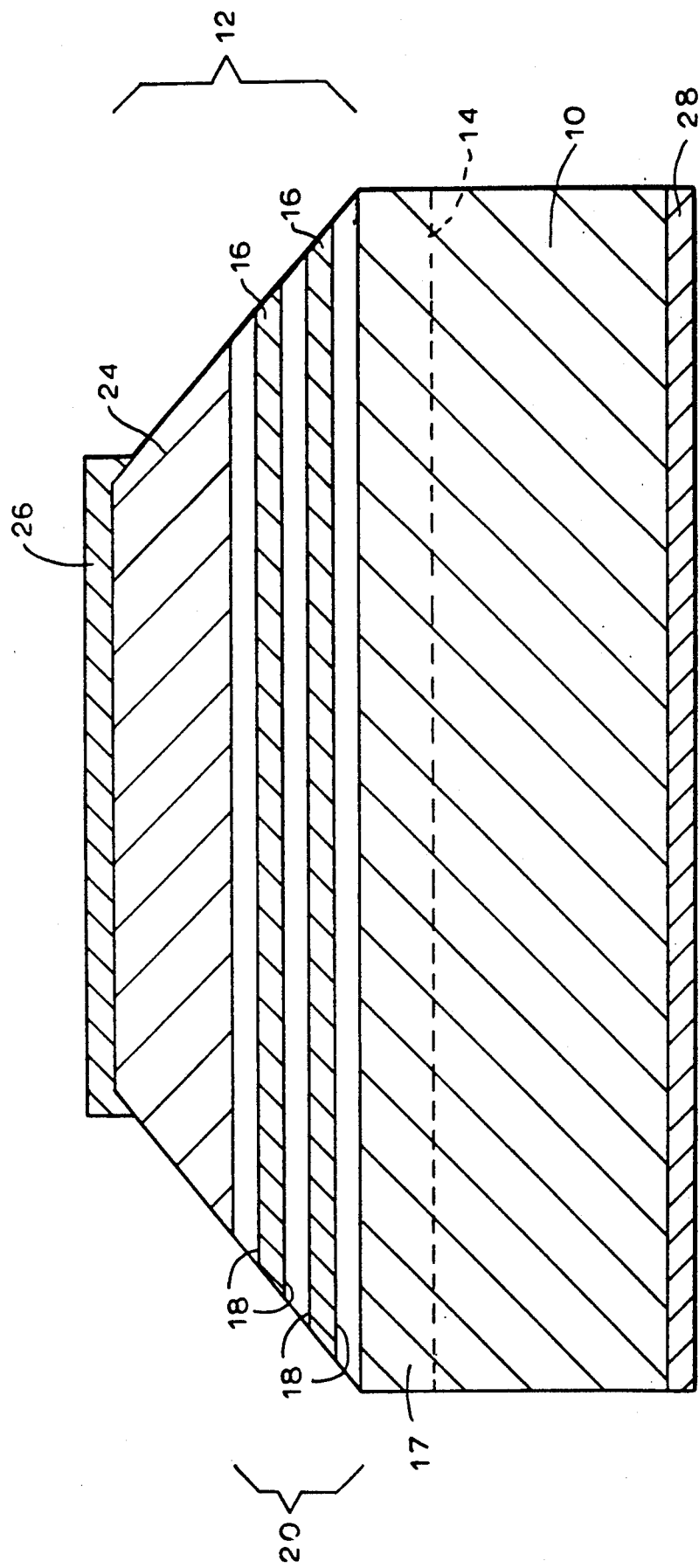
FIG. 3 is a schematic cross-sectional of an idealized device having a plurality of silicon-germanium regions formed in the depletion region, in accordance with the present invention.

FIG. 3 shows a preferred embodiment of a bipolar device fabricated in accordance with the present invention wherein two spaced germanium containing layers 16, each having two misfit dislocations containing interfaces 18 are formed. More than two germanium containing layers 16 can also be utilized, if desired. However, for simplicity, only two are shown. Regardless of the number of layers 16, the silicon/silicon germanium interfaces 18 formed are located in areas within the depletion region 20, which is the active region of the device, spaced from the substrate/epitaxial layer interface 14.

In the present invention, in contrast to the prior art extrinsic gettering techniques, the misfit dislocations do not function, and are not employed, to remove impurities from the depletion region. The misfit dislocations are associated with deep energy levels in the energy gap of silicon, similar to those sustained by metallic impurities. Hence, the presence of misfit dislocations within the depletion region directly results in the reduction of minority carrier lifetime. The use of misfit dislocations alone in the depletion region is a cleaner, more controllable technique than metal diffusion for increasing the switching speed of bipolar power devices.

In a preferred embodiment of the device, such as General Instrument's JAN1N 5807 through 5811 illustrated in FIG. 3, having a N— epitaxial layer 12 of 40 $\mu$m, for example, diffusion layer 17, could be 9 $\mu$m wide. Hence, it is preferred that the closest silicon/silicon-germanium interface 18 to the substrate/epitaxial layer interface 14 be approximately 9 $\mu$m. The diffused region 24 would be approximately 20 $\mu$m from interface 14 in such a device. Hence, the furthest misfit dislocations (interface 18) from interface 14 should preferably be approximately 20 $\mu$m. Accordingly, the misfit dislocations should preferably be within the range of approximately 9 to 20 $\mu$m from the substrate/epitaxial layer interface 14, most preferably toward the middle of that range.

The use of misfit dislocations as described above, along with metal diffusion, has a synergistic effect, with enhanced results as compared to either process individually. The misfit dislocations serve as efficient getter sites within the depletion region for the metallic impurities, increasing the concentration of the metallic impurities proximate the misfit dislocations to desired levels and providing full control over the position of the concentration peaks. Therefore, higher switching speeds can be achieved with smaller amounts of impurities, leaving the surface with minimal damage. This will result in faster devices, lower leakage currents, lower forward voltage drop, and larger breakdown voltages. In addition, combinations of dislocations and metal species gives rise to multiple energy levels, closer to mid gap, which may modify the recovery characteristics and provide a flexible mechanism for tailoring of device performance. This technique also allows the evaluation of deep levels and capture cross sections associated with misfit dislocations and their interactions with heavy metallic contaminants used for recovery speed control.

Figure 4:
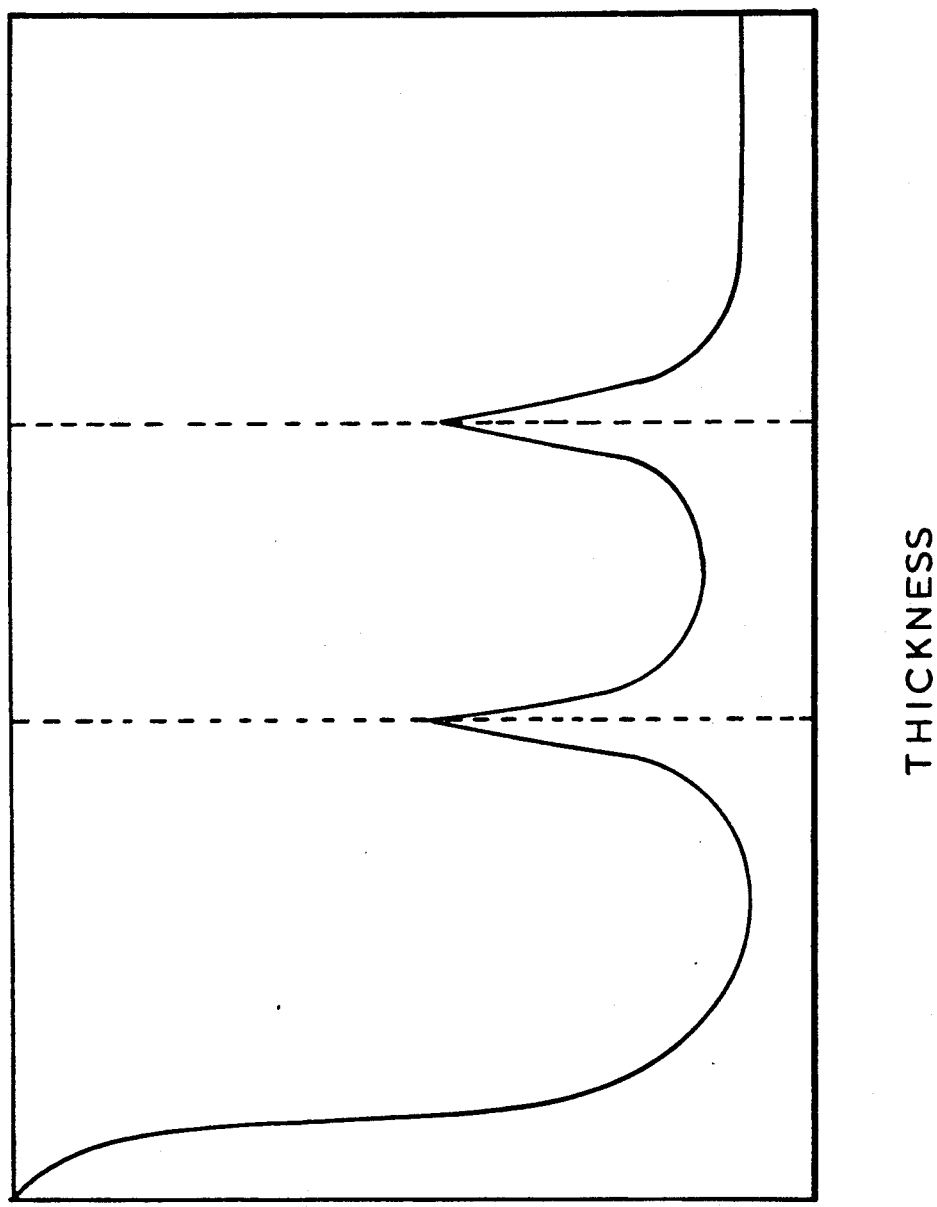
FIG. 4 is a graphical representation of the heavy metallic impurity precipitation expected for a device formed using conventional diffusion techniques.
Figure 5:
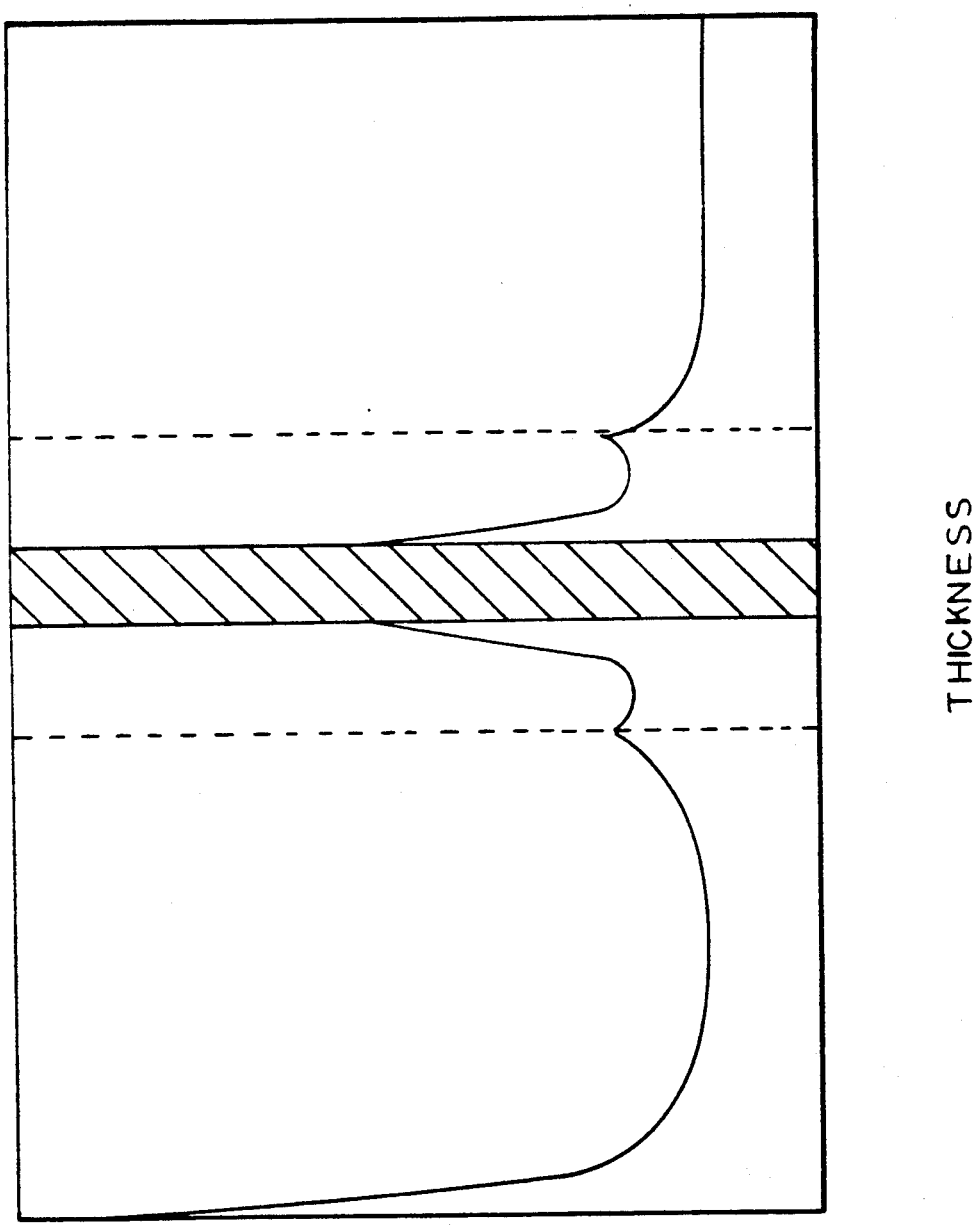
FIG. 5 is a graphical representation of the heavy metallic impurity precipitation expected for a device with one germanium layer formed with the method of the present invention.

FIGS. 4 and 5 are graphical representations of metallic impurity profiles. FIG. 4 illustrates the metallic impurity profile expected with heavy metallic impurities precipitation alone, introduced in accordance with conventional techniques. Note the large concentrations at the surface and diffusion interfaces and the low concentration in the depletion region.

FIG. 5 illustrates the metallic impurity profile expected from heavy metallic impurity precipitation in conjunction with misfit dislocations, as provided in accordance with the method of the prevent invention. Note the relatively low concentrations at the diffusion interfaces and the relatively high concentration proximate the misfit dislocations along the silicon/silicon-germanium interfaces proximate the center of the depletion region.

A comparison has been made of devices General Instrument's JAN1N 5807-5811 fabricated on wafers with varying numbers of areas of misfit dislocations, with 2% Ge formed in accordance with the present invention, with and without the introduction of gold as the metallic impurity. It has been found that without gold diffusion, the misfit dislocations decreased the reverse recovery time from about 500 to 70 ns. With gold introduction at 930° C. for 30 min, recovery time decreased with increasing number of germanium doped layers from approximately 35 ns, without any dislocations, down to the 17 ns, for samples with three spaced germanium containing layers boardered by misfit dislocations. In a second experiment with larger germanium concentration (4% Ge) i.e. dislocation density, recovery time was reduced to less than 30 ns with misfit dislocations only and no gold diffusion. The leakage current at 100° C. was 50% less than that produced by gold only devices.

While only a limited number of preferred embodiments have been disclosed herein for purposes of illustration, it is obvious that many variations and modifications could be made thereto. It is intended to cover all of these variations and modifications which fall within the scope of present invention, as defined by the following claims:

I claim:

1. In bipolar power semiconductor device of the type comprising a silicon substrate with first and second surface areas, an epitaxial layer formed in said substrate comprising a depletion region of a first conductivity type and a region of a second conductivity type, and first and second metalized layers situated on said first and second surface areas, respectively, the improvement comprising a germanium containing region defining a silicon/silicon-germanium interface formed under conditions which result in misfit dislocations in said depletion region.

2. The device of claim 1 wherein said substrate and said epitaxial layer form an interface and wherein said misfit dislocations are spaced from said interface.

3. The device of claim 2 wherein said misfit dislocations are spaced from said interface in an area approximately 9–20 $\mu$m therefrom.

4. The device of claim 1 wherein said misfit dislocations are proximate said silicon/silicon-germanium interface.

5. The device of claim 4 wherein said germanium containing silicon region comprises germanium in the range of from 1% to 10%.

6. The device of claim 1 wherein said misfit dislocations are proximate the center of said depletion region.

7. The device of claim 1 further comprising a plurality of spaced areas of misfit dislocations.

8. The device of claim 7 further comprising a plurality of germanium containing regions each having a silicon/silicon-germanium interface and wherein each of said areas of misfit dislocations is proximate a different one of the silicon/silicon-germanium interfaces.

9. The device of claim 1 further comprising metallic impurities in the depletion region.

10. The device of claim 9 further comprising enhanced concentrations of metallic impurities proximate said misfit dislocations.

11. The device of claim 9 said misfit dislocations comprising means for gettering said metallic impurities.

12. The device of claim 9 further comprising a flexible mechanism for tailoring recovery characteristics.

* * * * *